(12) United States Patent
Ziegler et al.

(10) Patent No.: US 12,069,800 B2
(45) Date of Patent: Aug. 20, 2024

(54) CIRCUIT BOARD ARRANGEMENT, DIFFERENTIAL PROBE CIRCUIT AND METHOD

(71) Applicant: Rohde & Schwarz GmbH & Co. KG, Munich (DE)

(72) Inventors: Andreas Ziegler, Munich (DE); Stefan Ketzer, Geiersthal (DE)

(73) Assignee: Rohde & Schwarz GmbH & Co. KG, Munich (DE)

(*) Notice: Subject to any disclaimer, the term of this patent is extended or adjusted under 35 U.S.C. 154(b) by 478 days.

(21) Appl. No.: 17/469,489

(22) Filed: Sep. 8, 2021

(65) Prior Publication Data

US 2023/0076176 A1    Mar. 9, 2023

(51) Int. Cl.
*H05K 1/00* (2006.01)
*G01R 19/10* (2006.01)
*H05K 1/02* (2006.01)
*H05K 3/00* (2006.01)

(52) U.S. Cl.
CPC ........... *H05K 1/0271* (2013.01); *G01R 19/10* (2013.01); *H05K 1/0254* (2013.01); *H05K 3/0044* (2013.01); *H05K 2201/09063* (2013.01)

(58) Field of Classification Search
CPC .. H05K 1/0271; H05K 1/0254; H05K 3/0044; H05K 2201/09063; G01R 19/10
See application file for complete search history.

(56) References Cited

U.S. PATENT DOCUMENTS

| | | | |
|---|---|---|---|
| 6,347,043 B1* | 2/2002 | Natarajan | H05K 9/0064 361/801 |
| 2003/0107876 A1* | 6/2003 | Suzuki | H05K 3/366 361/736 |
| 2018/0123304 A1* | 5/2018 | Parker | H01R 43/0256 |
| 2019/0103691 A1* | 4/2019 | Sypolt | H01R 13/631 |
| 2020/0057094 A1 | 2/2020 | Swaim et al. | |
| 2020/0287325 A1 | 9/2020 | Wilcox et al. | |
| 2021/0159623 A1* | 5/2021 | Sakurai | H01Q 9/42 |

* cited by examiner

*Primary Examiner* — Pete T Lee
(74) *Attorney, Agent, or Firm* — Patterson + Sheridan, LLP

(57) ABSTRACT

The present disclosure provides a circuit board arrangement comprising a main board comprising at least one longitudinal cutout, at least one reinforcing plate arranged in the at least one longitudinal cutout and mechanically coupled to the main board, wherein the plane of main extension of the main board is arranged perpendicular to the plane of main extension of the at least one reinforcing plate. Further, the present disclosure provides a differential probe circuit and a respective method.

19 Claims, 6 Drawing Sheets

CIRCUIT BOARD ARRANGEMENT, DIFFERENTIAL PROBE CIRCUIT AND METHOD

TECHNICAL FIELD

The disclosure relates to a circuit board arrangement, a differential probe circuit and a respective method.

BACKGROUND

Although applicable to any printed circuit board, the present disclosure will mainly be described in conjunction with printed circuit boards in probe connection circuits for measurement equipment.

In measurement probes for high voltage measurements an electrical isolation has to be provided for high-voltage carrying sections of the probe connection circuits. Such an electrical isolation may be provided in the form of free space or creepage distances, or by providing respective isolation materials around the respective sections of the probe connection circuits.

There is a need for providing an improved isolation in probe connection circuits.

SUMMARY

The above stated problem is solved by the features of the independent claims. It is understood, that independent claims of a claim category may be formed in analogy to the dependent claims of another claim category.

Accordingly, it is provided:

A circuit board arrangement comprising a main board comprising at least one longitudinal cutout, also called notch, and at least one reinforcing plate, also called rib or fin, arranged in the at least one longitudinal cutout and mechanically coupled to the main board, wherein the plane of main extension of the main board is arranged perpendicular to the plane of main extension of the at least one reinforcing plate.

Further, it is provided:

A differential probe circuit comprising a circuit board arrangement according to the present disclosure, and a conductive housing.

Further, it is provided:

A method for manufacturing a circuit board arrangement, the method comprising providing at least one longitudinal cutout in a main board, arranging at least one reinforcing plate in the at least one longitudinal cutout, and mechanically coupling the reinforcing plate to the main board, wherein the plane of main extension of the main board is arranged perpendicular to the plane of main extension of the at least one reinforcing plate.

The present disclosure is based on the finding that providing an electrical isolation in probe connection circuits by means of respective free space or creepage distances increases the size of the probe connection circuit. At the same time, the present disclosure is based on the finding that providing an isolation material around the high-voltage carrying sections of a circuit board reduces the size of the circuit board, but requires to provide notches in the circuit board that allow fully positioning the isolating material around the high-voltage carrying sections of the circuit board.

However, if notches are provided in the circuit board, the mechanical stability of the circuit board is reduced. Even if the circuit board may be covered by a respective housing in the final application, during production of the circuit board mechanical stress may be put on the circuit board and the circuit lines or traces and the components mounted on the circuit board. Such mechanical stress may damage the circuit lines or components and e.g., cause micro-fissures or microscopic cracks. Further, if the position of the elements of the main board is changed, even if only by a very small amount, the distance of the high-voltage carrying sections to a common ground may be disbalanced. Especially in differential measurement applications, such a circuit may cause common mode interference.

In order to reduce the chances of mechanical stress causing any damage to circuit lines or components, the circuit board arrangement according to the present disclosure provides the main board with a mechanical reinforcement i.e., the reinforcing plate. Such a reinforcing plate may also be called a rib or fin.

If longitudinal cutouts are provided next to the high-voltage carrying sections on the main board to put the isolating material over and around these sections, the high-voltage carrying sections form tongues or protruding sections that may be bent more easily when handling the circuit board arrangement, thereby introducing mechanical stress to these sections.

The reinforcing plate may therefore engage with the main board in a respective one of the longitudinal cutouts and mechanically couple to the longitudinal cutout. It is understood, that the main board may comprise a single longitudinal cutout or any other number of longitudinal cutouts as required by the respective design and application. Further, the circuit board arrangement may comprise any number of reinforcing plates as required in the respective design and application, wherein the number of longitudinal cutouts may be larger than the number of reinforcing plates, or vice versa.

The reinforcing plate is arranged such that the plane of main extension of the reinforcing plate is perpendicular to the plane of main extension of the main board.

In such an arrangement the possible bending direction of the high-voltage carrying sections of the main board is parallel to the plane of main extension of the reinforcing plate. The reinforcing plate, however, will provide a strong counterforce or opposing force to any bending movement in its plane of main extension.

Should for any reason a force be generated on the reinforcing plate that is perpendicular to its plane of main extension, the circuit board will provide the same type of counterforce or opposing force to that bending force.

Providing a circuit board arrangement with a main board and a reinforcing plate, allows using an isolating material to fully cover the high-voltage carrying sections on the main board, instead of providing respective free space or creepage distances.

Therefore, the components on the main board may be placed closer to each other while providing the required electrical isolation with the isolating material. Consequently, the overall size of the circuit board arrangement may be reduced. The reinforcing plates also dispense with the use of a thicker and more robust material for the main board.

Further embodiments of the present disclosure are subject of the further dependent claims and of the following description, referring to the drawings.

In a further embodiment, the at least one reinforcing plate may comprise a plate groove configured to accommodate an edge of the main board. The plate groove may further be oriented parallel to the direction of longitudinal extension of the longitudinal cutout of the main board.

The plate groove may extend over the full length of the reinforcing plate. This allows putting the reinforcing plate over an edge of the main board and accommodating the edge in the plate groove. The mounted reinforcing plate is therefore in an interlocking state with the main board.

It is understood, that the reinforcing plate is very stiff in its plane of main extension, while it may be flexible in a direction perpendicular to this plane.

When mounted onto the main board, the plane of main extension of the reinforcing plate is parallel to the bending forces that may impact the main board. Consequently, with a mounted reinforcing plate, such forces will be absorbed by the reinforcing plate.

In another embodiment, in a mounted state of the reinforcing plate, the edge of the main board in the longitudinal cutout may be arranged in the plate groove.

As explained above, the high-voltage carrying sections of the main board are especially susceptible to bending forces, because of the longitudinal cutout or multiple longitudinal cutouts that may form kinds of tongues from the high-voltage carrying sections of the main board.

Arranging the reinforcing plate such, that the edge of the mainboard in the longitudinal cutout is accommodated in the plate groove, therefore allows reinforcing the most fragile sections of the main board.

In an embodiment, in a mounted state of the at least one reinforcing plate, the at least one reinforcing plate may be mechanically fixed to the main board.

It is understood, that the reinforcing plate may be put on the edge of the main board and be held in position by respective clamping forces. In embodiments, however, the reinforcing plate may also be mechanically fixed to the main board, for example by at least one of a fixation element or gluing the reinforcing plate to the main board. Possible fixation elements may comprise snap in elements or hooks or detent lugs, but are not limited to these examples.

In yet another embodiment, the at least one reinforcing plate may comprise a slide-in cutout on at least one end in longitudinal direction, wherein the slide-in cutout is provided overlapping the plate groove.

The slide-in cutout serves for sliding the main board into the slide-in cutout. The slide-in cutout therefore may comprise the same thickness as the plate groove, that allows accommodating the main board. At the same time, the slide-in cutout is positioned at the same height or overlapping the plate groove, such that the section of the main board in the slide-in cutout may directly extend into the edge of the longitudinal cutout that is accommodated in the plate groove.

If in the mounted state, the main board is accommodated in the slide-in cutout, any force that is put on the main board in a direction perpendicular to its plane of main extension, at the point where it is supported by the reinforcing plate, is distributed into the main board. Without this additional interlocking of the main board and the reinforcing plate, a breaking point or kink point may exist at the end of the reinforcing plate.

It is understood, that the reinforcing plate may comprise a slide-in cutout on both ends in longitudinal direction, this allows using the same reinforcing plate either on a left side longitudinal cutout or on a right side longitudinal cutout of a high-voltage carrying section of the main board.

In a further embodiment, the at least one reinforcing plate may comprise an electrically isolating material.

Since the main board may carry high voltages, it is desirable to provide all elements, but the actual circuit elements and traces, from non-conductive or electrically isolating material.

It is understood, that the main board may for example comprise FR4 or any other printed circuit board carrier material, which are usually electrically isolating materials.

The reinforcing plate may also comprise an electrically isolating material. Such a material may be FR4 or any other electrically isolating material, like for example glass or ceramic materials.

In another embodiment, the at least one reinforcing plate may comprise the same material as the main board.

If the same material is used for the reinforcing plate as is used for the main board, the creepage distances of the original main board are not altered or are only altered to very little degree.

Further, the reinforcing plate may be produced out of scrap materials that are left over when producing the main board.

In an embodiment, the height of the at least one reinforcing plate in the center of the reinforcing plate in longitudinal direction may be larger than the height of the at least one reinforcing plate on the ends of the reinforcing plate in longitudinal direction.

The reinforcing plate should be as small as possible to reduce the possible impact of the presence of the reinforcing plate in the circuit board arrangement. For example, parasitic impedances caused by the reinforcing plate should be reduced as much as possible.

Therefore, the overall height of the reinforcing plate should be as low as possible. In order to increase the stiffness provided by the reinforcing plate, the height of the reinforcing plate may be larger in the center of the reinforcing plate than at the ends of the reinforcing plate.

In yet another embodiment, the main board may comprise at least one protrusion that is delimited on at least one side by the at least one longitudinal cutout and at least one reinforcing plate.

The protrusion may form a tongue in the plane of main extension of the main board. The protrusion may be delimited on one side or on both sides by a longitudinal cutout.

A reinforcing plate may be provided in only one or in both of the longitudinal cutouts to support the protrusion.

It is understood, that the main board may comprise one or more protrusions. The main board may especially comprise two protrusions, one for every measurement contact in a high-voltage differential measurement application.

In a further embodiment, the at least one protrusion may be configured to carry a high-voltage signal path.

The protrusion may carry for example a connector for a measurement cable and a multi-step voltage divider coupled between the connector and further circuitry on the main board. After the voltage divider, the voltage may be reduced to a level that does not require special isolation measures.

Along the protrusion, however, that carries the high-voltage signal path, the longitudinal cutout provides an air gap or creepage distance for isolating the high-voltage signal path.

In an embodiment, the high-voltage signal path may comprise at least a connector at a distal end of the protrusion and a voltage divider electrically coupled to the electrical connector. A low-voltage output of the voltage divider may be coupled to further electrical components that may be arranged on the main board.

In another embodiment, the circuit board arrangement may comprise an isolating element arranged over the protrusion.

The isolating element may for example be a tube with a round or square profile or cross section that may be put over the protrusion like a kind of sleeve.

The isolating element may comprise any adequate electrically isolating material. Such a material may for example be a polyimide film that is available under the brand name "Kapton" or other names.

The isolating element may be pre-fabricated and may simply be put over the respective protrusion during production of the circuit board arrangement. It is understood, that the reinforcing plate may be provided inside of the isolating element.

Isolating the protrusions allows providing the protrusions with a smaller distance between them and a ground section on the main board. Connectors on the protrusions may, therefore, in an embodiment be provided as standard 4 mm connectors with a standard distance of 19 mm. Further, such connectors may be mounted on the main board with standard soldering processes. There is no need to fix the measurement cables to the main board and measurement cables may easily be exchanged.

BRIEF DESCRIPTION OF THE DRAWINGS

For a more complete understanding of the present disclosure and advantages thereof, reference is now made to the following description taken in conjunction with the accompanying drawings. The disclosure is explained in more detail below using exemplary embodiments which are specified in the schematic figures of the drawings, in which.

In the figures like reference signs denote like elements unless stated otherwise.

DETAILED DESCRIPTION OF THE DRAWINGS

Figure 1:
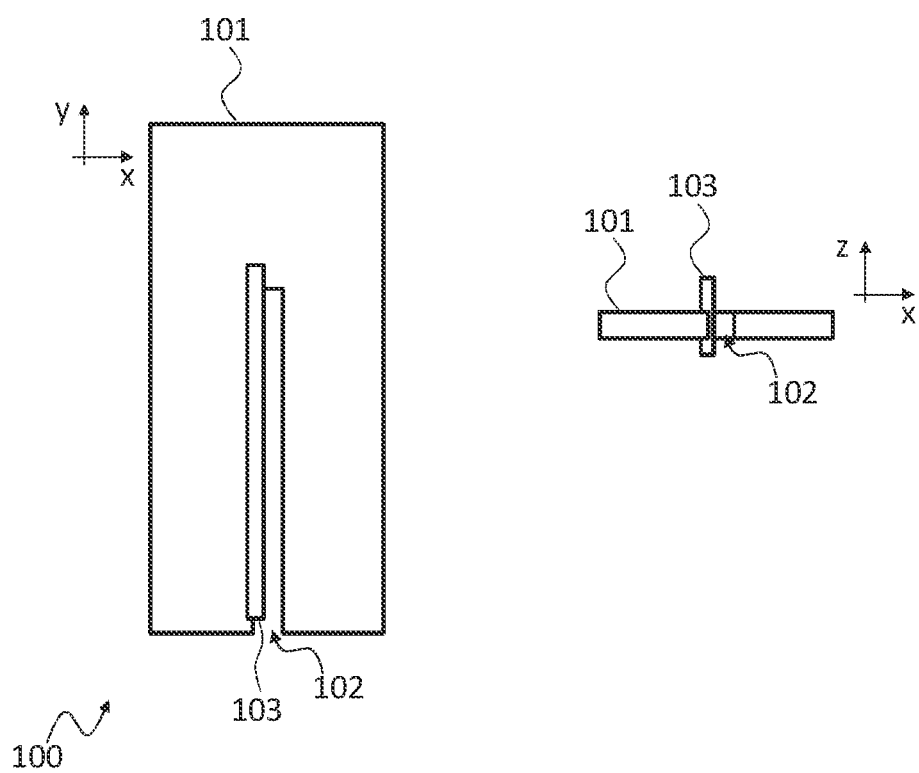
FIG. 1 shows a schematic view of an embodiment of a circuit board arrangement according to the present disclosure in a top view and a front view.

FIG. 1 shows a schematic view of a circuit board arrangement 100 in a top view on the left and a front view on the right. The top view is marked by a x-y coordinate system, while the front view is marked by a x-z coordinate system.

The circuit board arrangement 100 comprises a main board 101 with a longitudinal cutout 102, and a reinforcing plate 103. The reinforcing plate 103 is arranged in the longitudinal cutout 102 and mechanically coupled to the main board 101.

The plane of main extension of the main board 101 i.e., the x-y plane, is arranged perpendicular to the plane of main extension of the reinforcing plate 103 i.e., the z-y plane.

It can be seen in the front view, that the reinforcing plate 103 comprises a groove (see FIG. 2 for details) that engages with the edge of the main board 101 in the area of the longitudinal cutout 102. By engaging the reinforcing plate 103 with the main board 101 the main board 101 becomes firmly supported by the reinforcing plate 103, and a bending movement of the main board 101 in z direction is prevented.

It is understood, that providing a groove in the reinforcing plate 103 is only one of a plurality of possible solutions to secure the main board 101 to the reinforcing plate 103. In an embodiment, the reinforcing plate 103 may for example be glued to the main board 101 as alternative or in addition to engaging the main board 101 in the groove. In another embodiment, mechanical fixation elements, like lugs, hooks, engaging protrusions may be provided to mechanically fix the main board 101 to the reinforcing plate 103, as alternative or in addition to engaging or gluing the main board 101 in the groove.

In the circuit board arrangement 100 the main board 101 comprises only one longitudinal cutout 102, and one respective reinforcing plate 103 is arranged in the longitudinal cutout 102. In other embodiments, the circuit board arrangement 100 may comprise multiple longitudinal cutouts. Further, more than one reinforcing plate 103 may be provided on such a main board. It is also understood, that the reinforcing plates not necessarily need to be coupled to the main board in one of the longitudinal cutouts. Instead, the reinforcing plates may also be coupled to an outer edge of the main board e.g., to the right or left outer edge along the y axis.

The reinforcing plate 103 is shown to have a square shape when viewed from the x direction i.e. in the y-z plane. It is understood, that the reinforcing plate 103 may also comprise any other adequate shape. A possible shape of such a reinforcing plate is shown in FIG. 2.

Although not explicitly shown, it is understood, that the main board 101 may carry a plurality of electrical components, like connectors, resistors, inductors, capacitors, traces and the like, as required by the respective application. A possible embodiment of such a main board 101 is explained in more detail below in conjunction with FIG. 3.

The main board 101 and the reinforcing plate 103 may both be provided from the same material, like for example a printed circuit board carrier substrate, like a FR4 substrate. The main board 101 and the reinforcing plate 103 may in embodiments also be provided from different materials.

Figure 2:
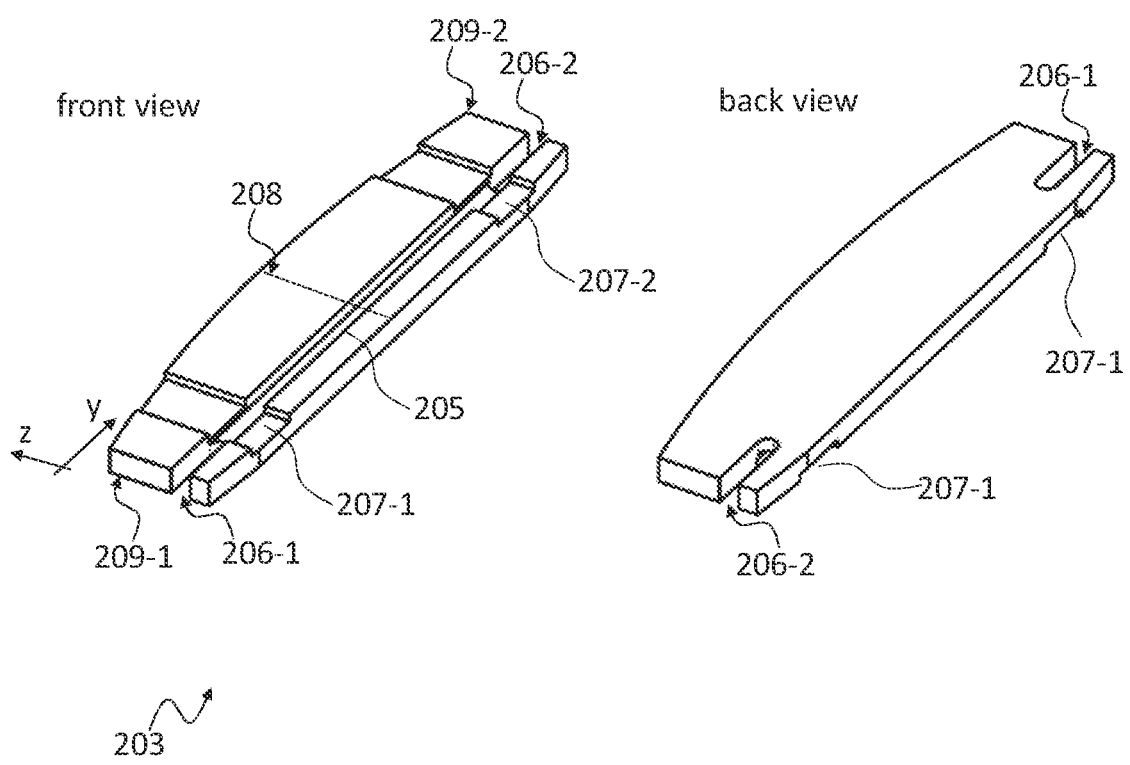
FIG. 2 shows a perspective view of an embodiment of a reinforcing plate according to the present disclosure in a front view and a back view.

FIG. 2 shows a perspective view of a reinforcing plate 203 in a front view (left) and a back view (right).

The reinforcing plate 203 comprises a shape that is higher in the z direction in the center 208 of the reinforcing plate 203, than at the ends 209-1, 209-2 of the reinforcing plate 203. The upper edge of the reinforcing plate 203 may for example be shaped as a circular section with a specific radius. Alternatively, a section-wise linear or straight shaped edge may also be provided. As indicated above, any other adequate shape may also be provided.

The reinforcing plate 203 comprises a plate grove 205. The plate grove 205 extends on one side of the reinforcing plate 203 from one end 209-1 to the other end 209-2 of the reinforcing plate 203. As explained above, the plate grove 205 serves for accommodating the edge of the main board to mechanically stabilize the main board against movement in the z axis.

Consequently, the width of the plate grove 205 will be adapted to the thickness of the main board. It is understood, that the plate grove 205 may be designed to accommodate the main board with a specific clamping force. In another embodiment, the plate grove 205 may be designed to loosely accommodate the main board, which may then for example be glued to the reinforcing plate 203.

The reinforcing plate 203 further comprises two slide-in cutouts 206-1, 206-2, one on each end. The slide-in cutouts 206-1, 206-2 are provided overlapping with the plate grove 205 and traverse the reinforcing plate 203 from the front side to the back side.

The slide-in cutouts 206-1, 206-2 serve to accommodate a section of the main board at the inner or back end of the respective longitudinal cutout. In the region of the slide-in cutouts 206-1, 206-2 the main board and the reinforcing plate 203 may therefore be fitted into each other. A force on the reinforcing plate 203 in the z direction will therefore be transmitted to the main board via this interlocking mechanism and improve stability of the protruding section of the main board that is supported by the reinforcing plate 203 in the plate grove 205. It is understood, that a respective cutout may also be provided on the main board at the inner end of the longitudinal cutout.

The reinforcing plate 203 further comprises grooves 207-1, 207-2. These grooves 207-1, 207-2 are optional and are only shown to exemplify that components that may be mounted on the main board may be accommodated by such grooves 207-1, 207-2. The grooves 207-1, 207-2 may therefore be shaped in any shape required to accommodate respective components, like for example connectors or the like. The grooves 207-1, 207-2 may also at least in part be cutouts that traverse the full thickness of the reinforcing plate 203.

The reinforcing plate 203 is symmetrical to the center 208. This allows using the reinforcing plate 203 in both ways, with the plate grove 205 showing to the right i.e. in +x direction, or to the left i.e., in −x direction.

In an embodiment, the reinforcing plate 203 may also be provided with one of the slide-in cutouts 206-1, 206-2 e.g., on the first end 206-1, and if required with only on groove 207-1 on the same end.

Figure 3:
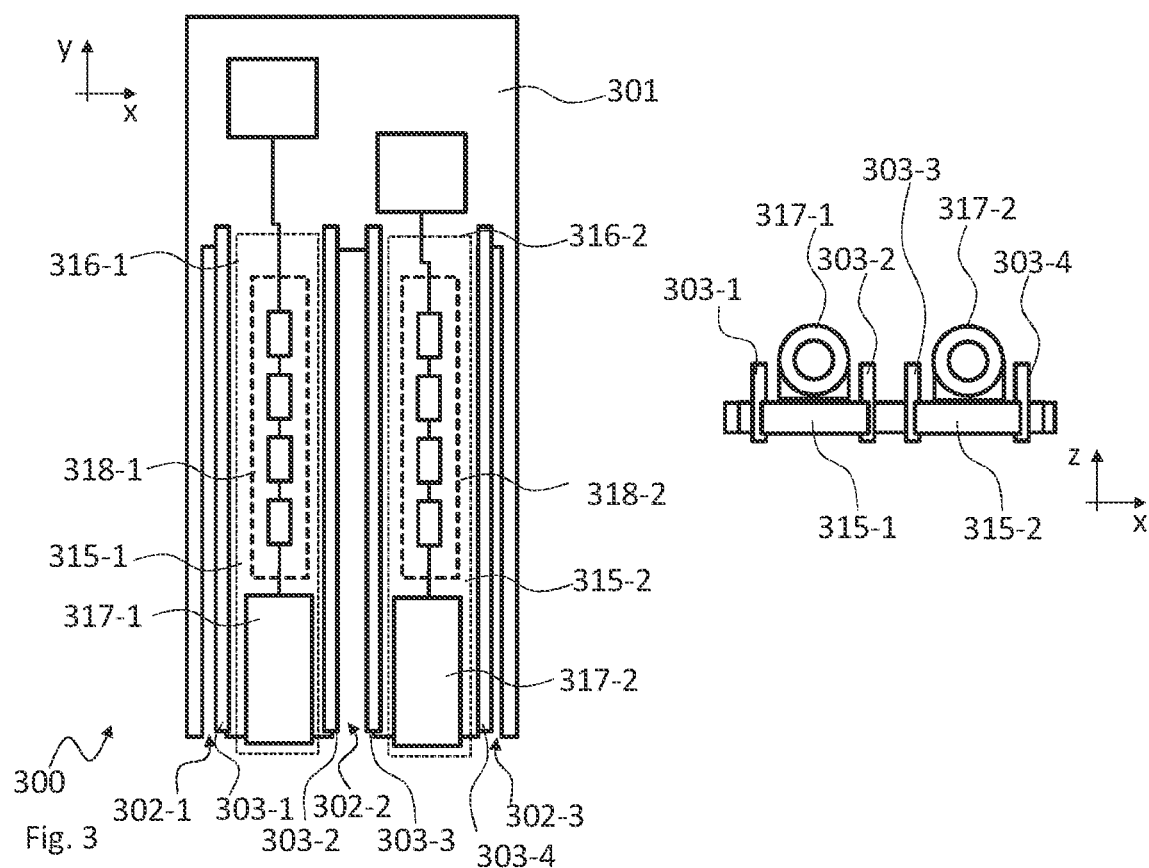
FIG. 3 shows another schematic view of an embodiment of a circuit board arrangement according to the present disclosure in a top view and a front view.

FIG. 3 shows another circuit board arrangement 300 in a top view on the left and a front view on the right. The top view is marked by a x-y coordinate system, while the front view is marked by a x-z coordinate system.

The circuit board arrangement 300 is based on the circuit board arrangement 100. The circuit board arrangement 300, therefore, also comprises a main board 301. In the main board 301 three longitudinal cutouts 302-1, 302-2, 302-3 are provided, and a total of four reinforcing plates 303-1, 303-2, 303-3, 303-4 are attached to the main board 301 in the longitudinal cutouts 302-1, 302-2, 302-3.

The first longitudinal cutout 302-1 is provided on the left side of the main board 301, leaving a narrow strip of main board 301 on the left. The third longitudinal cutout 302-3 is provided on the right side of the main board 301, also leaving a narrow strip of main board 301 on the right. The second longitudinal cutout 302-2 is provided in the center of the main board 301.

The sections of main board 301 between the first longitudinal cutout 302-1 and the second longitudinal cutout 302-2, and the second longitudinal cutout 302-2 and the third longitudinal cutout 302-3, respectively, form protrusions 315-1, 315-2 or tongues.

Each one of these protrusions 315-1, 315-2 carries a high-voltage signal path 316-1, 316-2. Exemplarily, each one of the high-voltage signal paths 316-1, 316-2 comprises a connector 317-1, 317-2 at its distal end, and a schematically shown voltage divider 318-1, 318-2 arranged between the respective connector 317-1, 317-2 and further electrical components provided on the main section of the main board 301.

It is understood, that the connectors 317-1, 317-2 and the voltage dividers 318-1, 318-2 are only exemplarily shown, and that the protrusions 315-1, 315-2 may carry any other components in addition to or instead of the connectors 317-1, 317-2 and the voltage dividers 318-1, 318-2.

In the front view it can be clearly seen, that one of the reinforcing plates 303-1, 303-2, 303-3, 303-4 is provided in the left or first longitudinal cutout 302-1, one of the reinforcing plates 303-1, 303-2, 303-3, 303-4 is provided in the right or third longitudinal cutout 302-3, and two of the reinforcing plates 303-1, 303-2, 303-3, 303-4 are provided in the center or second longitudinal cutout 302-2.

Of course not necessarily four reinforcing plates 303-1, 303-2, 303-3, 303-4 need to be provided. In embodiments, less than four reinforcing plates 303-1, 303-2, 303-3, 303-4 may be provided. For example, not every one of the protrusions 315-1, 315-2 needs to be secured with two reinforcing plates 303-1, 303-2, 303-3, 303-4.

Further, although not explicitly shown, the narrow strips of main board 301 on the left and the right side of the protrusions 315-1, 315-2 may carry any adequate component.

Figure 5:
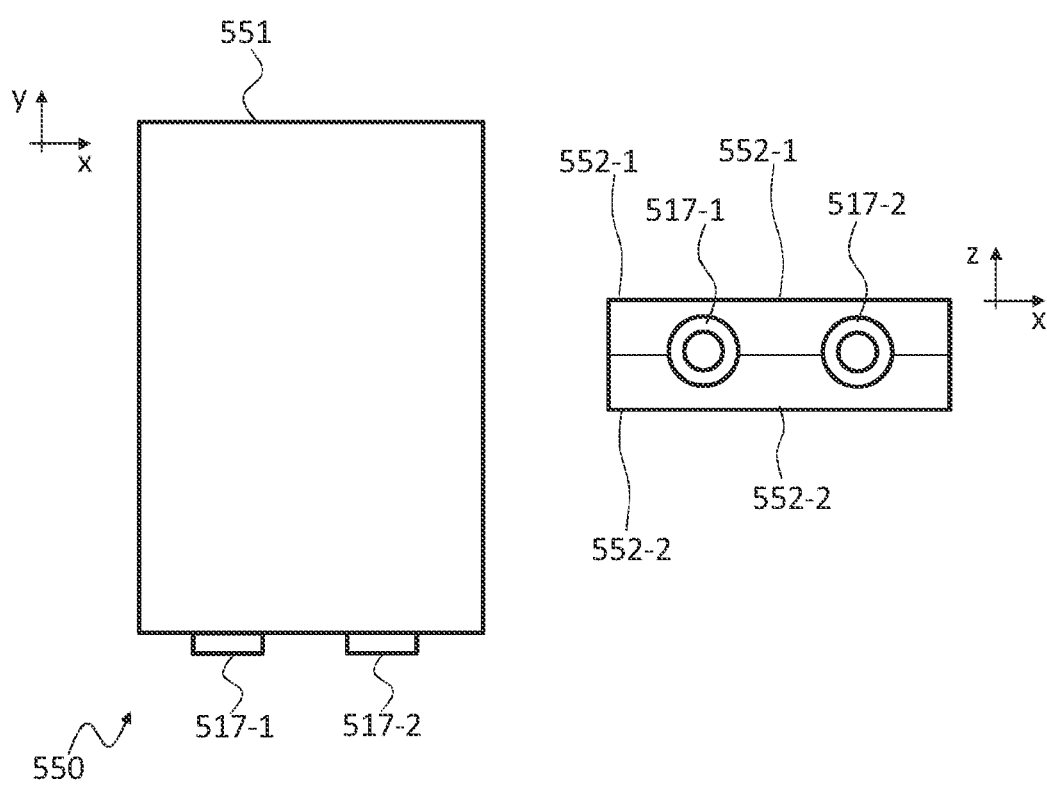
FIG. 5 shows a schematic view of an embodiment of a differential probe circuit according to the present disclosure in a top view and a front view.

These strips may for example carry mechanical and/or electrical fixations for a cover that may be provided over the main board 301, e.g. a metallic cover, as is shown in FIG. 5.

Figure 4:
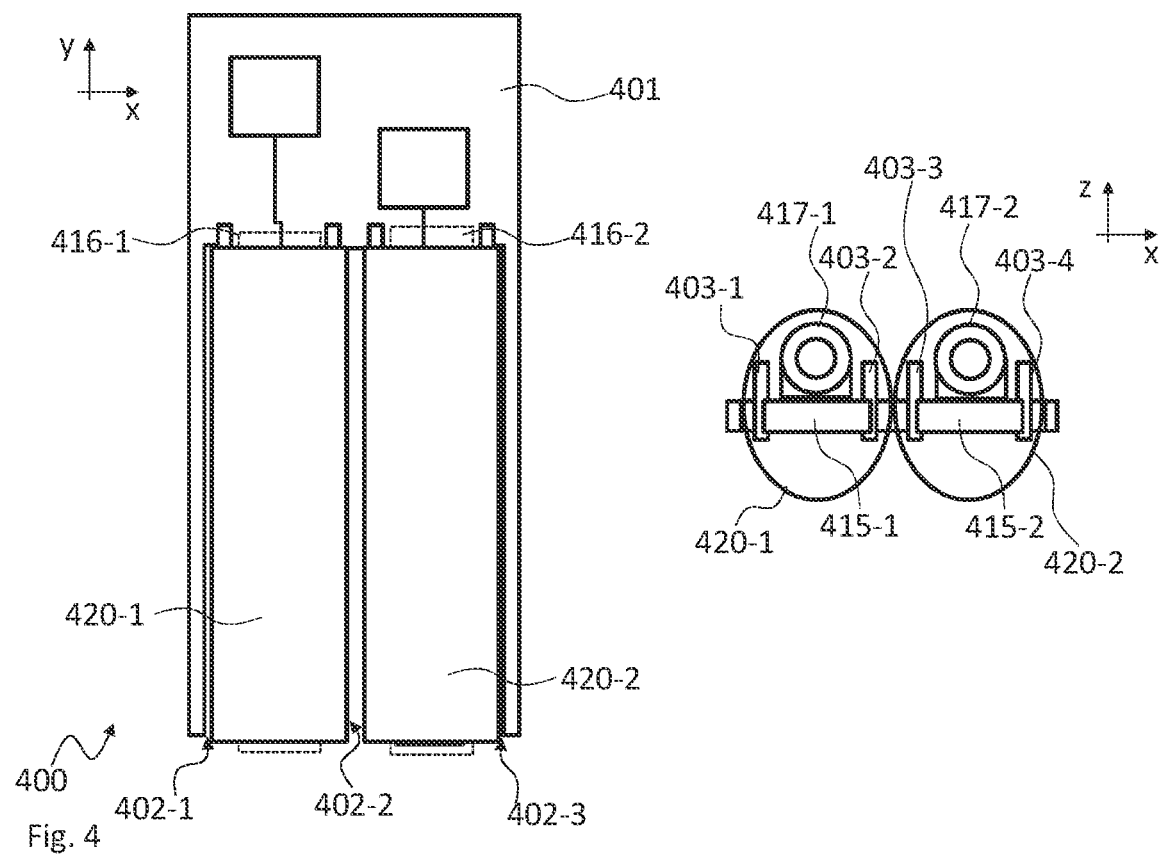
FIG. 4 shows another schematic view of an embodiment of a circuit board arrangement according to the present disclosure in a top view and a front view.

FIG. 4 shows another circuit board arrangement 400 in a top view on the left and a front view on the right. The top view is marked by a x-y coordinate system, while the front view is marked by a x-z coordinate system.

The circuit board arrangement 400 is based on the circuit board arrangement 300 and, therefore, also comprises a main board 401. In the main board 401 three longitudinal cutouts 402-1, 402-2, 402-3 are provided, and a total of four reinforcing plates 403-1, 403-2, 403-3, 403-4 are attached to the main board 401 in the longitudinal cutouts 402-1, 402-2, 402-3. The explanations presented above with regard to circuit board arrangement 300 therefore also apply mutatis mutandis to circuit board arrangement 400.

The circuit board arrangement 400 further comprises two isolating elements 420-1, 420-2 that are put over the protrusions 415-1, 415-2 that are formed in the main board 401. The isolating elements 420-1, 420-2 are each put over one of the protrusions 415-1, 415-2 like a protective sleeve. In the front view on the right, it can be seen that the isolating elements 420-1, 420-2 are tube-like elements with an oval cross-section. Each one of the isolating elements 420-1, 420-2 covers one of the protrusions 415-1, 415-2 including the reinforcing plates 403-1, 403-2, 403-3, 403-4 that are attached to the respective protrusion 415-1, 415-2, and the components of the respective high-voltage signal path 416-1, 416-2.

The cross-section of the isolating elements 420-1, 420-2 in other embodiments may have another shape, for example a round or quadratic or rectangular shape.

FIG. 5 shows a schematic view of a differential probe circuit 550 in a top view on the left and a front view on the right. The differential probe circuit 550 may for example serve to couple a device under test to a measurement device, like for example an oscilloscope.

The differential probe circuit 550 comprises a circuit board arrangement, for example the circuit board arrangement 400, that is covered by a housing 551. The housing 551 may for example be a conductive housing 551 made of conductive material, like for example metal.

The housing 551 may for example be formed of two half shells 552-1- and 552-2.

In differential probe circuit 550 the connectors 517-1, 517-2 are accessible from the outside to connect measurement cables to the differential probe circuit 550.

Although not explicitly shown, it is understood, that the circuit board arrangement of the differential probe circuit 550 may comprise further connectors, for example on the upper end i.e., in y direction, to couple the differential probe circuit 550 to a measurement device. Instead of further connectors, cables may also be mounted to the differential probe circuit 550 directly.

For sake of clarity in the following description of the method based FIG. 6 the reference signs used above in the description of apparatus based FIGS. 1-5 will be maintained.

Figure 6:
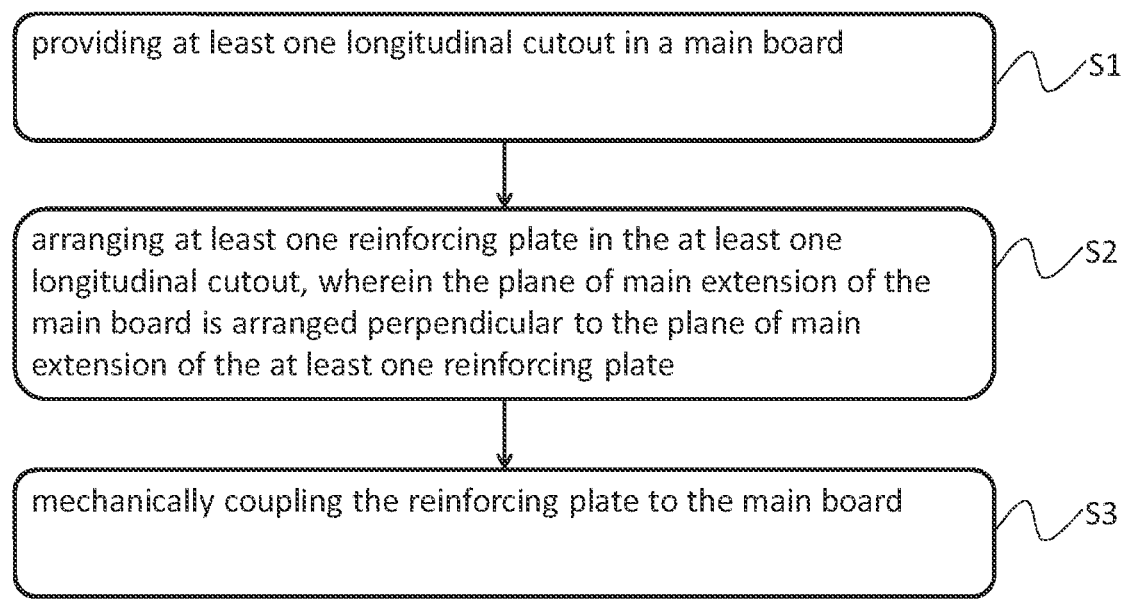
FIG. 6 shows a flow diagram of an embodiment of a method according to the present disclosure.

FIG. 6 shows a flow diagram of an embodiment of a method for manufacturing a circuit board arrangement 100, 300, 400.

The method comprises providing S1 at least one longitudinal cutout 102, 302-1, 302-2, 302-3, 402-1, 402-2, 402-3 in a main board 101, 301, 401, arranging S2 at least one reinforcing plate 103, 203, 303-1, 303-2, 303-3, 303-4, 403-1, 403-2, 403-3, 403-4 in the at least one longitudinal cutout 102, 302-1, 302-2, 302-3, 402-1, 402-2, 402-3, and mechanically coupling S3 the reinforcing plate 103, 203, 303-1, 303-2, 303-3, 303-4, 403-1, 403-2, 403-3, 403-4 to the main board 101, 301, 401. The plane of main extension of the main board 101, 301, 401 is arranged perpendicular to the plane of main extension of the at least one reinforcing plate 103, 203, 303-1, 303-2, 303-3, 303-4, 403-1, 403-2, 403-3, 403-4.

The at least one reinforcing plate 103, 203, 303-1, 303-2, 303-3, 303-4, 403-1, 403-2, 403-3, 403-4 may comprise at least one of an electrically isolating material, and the same material as the main board 101, 301, 401. Further, the height of the at least one reinforcing plate 103, 203, 303-1, 303-2, 303-3, 303-4, 403-1, 403-2, 403-3, 403-4 in the center 208 of the reinforcing plate 103, 203, 303-1, 303-2, 303-3, 303-4, 403-1, 403-2, 403-3, 403-4 in longitudinal direction may be larger than the height of the at least one reinforcing plate 103, 203, 303-1, 303-2, 303-3, 303-4, 403-1, 403-2, 403-3, 403-4 on the ends 209-1, 209-2 of the reinforcing plate 103, 203, 303-1, 303-2, 303-3, 303-4, 403-1, 403-2, 403-3, 403-4 in longitudinal direction.

The method may further comprise arranging a plate groove 205 configured to accommodate an edge of the main board 101, 301, 401 on the at least one reinforcing plate 103, 203, 303-1, 303-2, 303-3, 303-4, 403-1, 403-2, 403-3, 403-4. Such a plate groove 205 allows mechanically fixing the edge of the main board 101, 301, 401 e.g. with a form fit or form lock.

The plate groove 205 may be oriented parallel to the direction of longitudinal extension of the longitudinal cutout 102, 302-1, 302-2, 302-3, 402-1, 402-2, 402-3 of the main board 101, 301, 401. In a mounted state of the reinforcing plate 103, 203, 303-1, 303-2, 303-3, 303-4, 403-1, 403-2, 403-3, 403-4, the edge of the main board 101, 301, 401 in the longitudinal cutout 102, 302-1, 302-2, 302-3, 402-1, 402-2, 402-3 may, therefore, be arranged in the plate groove 205, and the at least one reinforcing plate 103, 203, 303-1, 303-2, 303-3, 303-4, 403-1, 403-2, 403-3, 403-4 may be mechanically fixed to the main board 101, 301, 401.

The method may also comprise arranging a slide-in cutout on at least one end of the at least one reinforcing plate 103, 203, 303-1, 303-2, 303-3, 303-4, 403-1, 403-2, 403-3, 403-4 in longitudinal direction, wherein the slide-in cutout 206-1, 206-2 may overlap with the plate groove 205.

The main board 101, 301, 401 may be provided with at least one protrusion 315-1, 315-2, 415-1, 415-2 that is delimited on at least one side by the at least one longitudinal cutout 102, 302-1, 302-2, 302-3, 402-1, 402-2, 402-3 and at least one reinforcing plate 103, 203, 303-1, 303-2, 303-3, 303-4, 403-1, 403-2, 403-3, 403-4, wherein the at least one protrusion 315-1, 315-2, 415-1, 415-2 may be configured to carry a high-voltage signal path 316-1, 316-2, 416-1, 416-2. An isolating element 420-1, 402-2 may be arranged over the protrusion 315-1, 315-2, 415-1, 415-2.

The method may also comprise providing a cover or housing 551 over the main board 101, 301, 401, in order to form a differential probe circuit 550 according to the present disclosure.

Although specific embodiments have been illustrated and described herein, it will be appreciated by those of ordinary skill in the art that a variety of alternate and/or equivalent implementations exist. It should be appreciated that the exemplary embodiment or exemplary embodiments are only examples, and are not intended to limit the scope, applicability, or configuration in any way. Rather, the foregoing summary and detailed description will provide those skilled in the art with a convenient road map for implementing at least one exemplary embodiment, it being understood that various changes may be made in the function and arrangement of elements described in an exemplary embodiment without departing from the scope as set forth in the appended claims and their legal equivalents. Generally, this application is intended to cover any adaptations or variations of the specific embodiments discussed herein.

LIST OF REFERENCE SIGNS

| | |
|---|---|
| 100, 300, 400 | circuit board arrangement |
| 101, 301, 401 | main board |
| 102, 302-1, 302-2, 302-3 | longitudinal cutout |
| 402-1, 402-2, 402-3 | longitudinal cutout |
| 103, 203, 303-1, 303-2, 303-3, 303-4 | reinforcing plate |
| 403-1, 403-2, 403-3, 403-4 | reinforcing plate |
| 205 | plate groove |
| 206-1, 206-2 | slide-in cutout |
| 207-1, 207-2 | groove |
| 208 | center of the reinforcing plate |
| 209-1, 209-2 | end of the reinforcing plate |
| 315-1, 315-2, 415-1, 415-2 | protrusion |
| 316-1, 316-2, 416-1, 416-2 | high-voltage signal path |
| 317-1, 317-2, 417-1, 417-2, 517-1, 517-2 | connector |
| 318-1, 318-2 | voltage divider |
| 420-1, 420-2 | isolating element |
| 550 | differential probe circuit |
| 551 | housing |
| 552-1, 552-2 | half shell |
| S1, S2, S3 | method steps |

The invention claimed is:

1. A circuit board arrangement comprising:
a main board comprising at least one longitudinal cutout; and
at least one reinforcing plate arranged in the at least one longitudinal cutout and mechanically coupled to the main board,
wherein the at least one reinforcing plate comprises a plate groove configured to accommodate an edge of the main board,
wherein the plate groove is oriented parallel to the direction of longitudinal extension of the longitudinal cutout of the main board,
wherein the at least one reinforcing plate comprises a slide-in cutout on at least one end in longitudinal direction, wherein the slide-in cutout is provided overlapping the plate groove, wherein a plane of main extension of the main board is arranged perpendicular to a plane of main extension of the at least one reinforcing plate.

2. The circuit board arrangement according to claim 1, wherein, in a mounted state of the at least one reinforcing plate, the edge of the main board in the longitudinal cutout is arranged in the plate groove.

3. The circuit board arrangement according to claim 1, wherein, in a mounted state of the at least one reinforcing plate, the at least one reinforcing plate is mechanically fixed to the main board.

4. The circuit board arrangement according to claim 1, wherein the at least one reinforcing plate comprises an electrically isolating material.

5. The circuit board arrangement according to claim 1, wherein the at least one reinforcing plate comprises the same material as the main board.

6. The circuit board arrangement according to claim 1, wherein the height of the at least one reinforcing plate in the center of the at least one reinforcing plate in longitudinal direction is larger than the height of the at least one reinforcing plate on the ends of the at least one reinforcing plate in longitudinal direction.

7. The circuit board arrangement according to claim 1, wherein the main board comprises at least one protrusion that is delimited on at least one side by the at least one longitudinal cutout and at least one reinforcing plate.

8. The circuit board arrangement according to claim 7, wherein the at least one protrusion is configured to carry a high-voltage signal path.

9. The circuit board arrangement according to claim 7, comprising an isolating element arranged over the protrusion.

10. A differential probe circuit comprising:
a circuit board arrangement comprising:
   a main board comprising at least one longitudinal cutout; and
   at least one reinforcing plate arranged in the at least one longitudinal cutout and mechanically coupled to the main board,
   wherein a plane of main extension of the main board is arranged perpendicular to a plane of main extension of the at least one reinforcing plate,
   wherein the at least one reinforcing plate of the circuit board arrangement comprises a slide-in cutout on at least one end in longitudinal direction, wherein the at least one reinforcing plate of the circuit board arrangement comprises a plate groove configured to accommodate an edge of the main board and wherein the slide-in cutout is provided overlapping the plate groove; and
a conductive housing.

11. The differential probe circuit according to claim 10, wherein the at least one reinforcing plate of the circuit board arrangement comprises a plate groove configured to accommodate an edge of the main board,
   wherein the plate groove is oriented parallel to the direction of longitudinal extension of the longitudinal cutout of the main board, and wherein, in a mounted state of the at least one reinforcing plate, the edge of the main board in the longitudinal cutout is arranged in the plate groove, and wherein, in a mounted state of the at least one reinforcing plate, the at least one reinforcing plate is mechanically fixed to the main board.

12. The differential probe circuit according to claim 10, wherein the at least one reinforcing plate of the circuit board arrangement comprises at least one of an electrically isolating material and the same material as the main board.

13. The differential probe circuit according to claim 10, wherein the height of the at least one reinforcing plate of the circuit board arrangement in the center of the at least one reinforcing plate in longitudinal direction is larger than the height of the at least one reinforcing plate on the ends of the at least one reinforcing plate in longitudinal direction.

14. The differential probe circuit according to claim 10, wherein the main board of the circuit board arrangement comprises at least two protrusions that are each delimited on at least one side by the at least one longitudinal cutout and at least one reinforcing plate, and an isolating element arranged over each one of the protrusions.

15. A method for manufacturing a circuit board arrangement, the method comprising:
providing at least one longitudinal cutout in a main board;
arranging at least one reinforcing plate in the at least one longitudinal cutout;
arranging a plate groove configured to accommodate an edge of the main board on the at least one reinforcing plate;
arranging a slide-in cutout on at least one end of the at least one reinforcing plate in longitudinal direction, wherein the slide-in cutout is provided overlapping the plate groove; and
mechanically coupling the at least one reinforcing plate to the main board,
wherein the plane of main extension of the main board is arranged perpendicular to the plane of main extension of the at least one reinforcing plate.

16. The method according to claim 15, further comprising arranging a plate groove configured to accommodate an edge of the main board on the at least one reinforcing plate,
   wherein the plate groove is oriented parallel to the direction of longitudinal extension of the longitudinal cutout of the main board, and wherein, in a mounted state of the at least one reinforcing plate, the edge of the main board in the longitudinal cutout is arranged in the plate groove, and wherein, in a mounted state of the at least one reinforcing plate, the at least one reinforcing plate is mechanically fixed to the main board.

17. The method according to claim 15, wherein the at least one reinforcing plate comprises at least one of an electrically isolating material, and the same material as the main board.

18. The method according to claim 15, wherein the height of the at least one reinforcing plate in the center of the at least one reinforcing plate in longitudinal direction is larger than the height of the at least one reinforcing plate on the ends of the at least one reinforcing plate in longitudinal direction.

19. The method according to claim 15, wherein the main board is provided with at least one protrusion that is delimited on at least one side by the at least one longitudinal cutout and at least one reinforcing plate,
   wherein the at least one protrusion is configured to carry a high-voltage signal path, and
   wherein an isolating element is arranged over the protrusion.

* * * * *